United States Patent
Yang

(10) Patent No.: US 11,929,132 B2
(45) Date of Patent: Mar. 12, 2024

(54) TESTING METHOD, TESTING SYSTEM, AND TESTING APPARATUS FOR SEMICONDUCTOR CHIP

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 209 days.

(21) Appl. No.: 17/595,609

(22) PCT Filed: Jun. 16, 2021

(86) PCT No.: PCT/CN2021/100358
§ 371 (c)(1),
(2) Date: Nov. 19, 2021

(87) PCT Pub. No.: WO2022/012255
PCT Pub. Date: Jan. 20, 2022

(65) Prior Publication Data
US 2022/0399068 A1    Dec. 15, 2022

(30) Foreign Application Priority Data
Jul. 13, 2020 (CN) .......................... 202010667480.2

(51) Int. Cl.
*G11C 29/12* (2006.01)

(52) U.S. Cl.
CPC .. *G11C 29/1201* (2013.01); *G11C 2029/1206* (2013.01)

(58) Field of Classification Search
CPC ........ G11C 29/1201; G11C 2029/1206; G11C 29/44; G11C 29/56; G11C 29/04
See application file for complete search history.

(56) References Cited

U.S. PATENT DOCUMENTS 6,449,200 B1 * 9/2002 Nelson ................... G11C 29/34
                                                              365/194
7,973,547 B2    7/2011 Nitsch
(Continued)

FOREIGN PATENT DOCUMENTS

CN      107632914 A    1/2018
CN      108806762 A    11/2018
(Continued)

OTHER PUBLICATIONS

International Search Report as cited in PCT Application No. PCT/CN2021/100358 dated Sep. 15, 2021, 9 pages.
(Continued)

*Primary Examiner* — Tuan T Nguyen
(74) *Attorney, Agent, or Firm* — Cooper Legal Group, LLC

(57) ABSTRACT

The present invention relates to a testing method, a testing system, and a testing apparatus for a semiconductor chip. The method includes: acquiring a target chip; obtaining an abnormal chip after a test of read and write functions is performed separately on a preset number of memory cells in an edge region of the target chip; recording location information of individual memory cells with abnormal read and write functions on the abnormal chip; judging whether an abnormality of read and write functions of the abnormal chip is a block abnormality based on the location information; wherein the abnormal chip refers to the target chip including the memory cell with abnormal read and write functions.

10 Claims, 3 Drawing Sheets

(56) References Cited

U.S. PATENT DOCUMENTS

| | | | |
|---|---|---|---|
| 11,600,539 B2* | 3/2023 | Lee | G01R 31/3187 |
| 2002/0040458 A1* | 4/2002 | Dervisoglu | G01R 31/318536 |
| | | | 714/729 |
| 2002/0041242 A1* | 4/2002 | Takahashi | G11C 29/26 |
| | | | 341/120 |
| 2005/0047229 A1* | 3/2005 | Nadeau-Dostie | G11C 29/40 |
| | | | 714/766 |
| 2008/0004823 A1 | 1/2008 | Matsushita et al. | |
| 2021/0320039 A1 | 10/2021 | Lee et al. | |

FOREIGN PATENT DOCUMENTS

| | | |
|---|---|---|
| CN | 110046284 A | 7/2019 |
| CN | 110456259 A | 11/2019 |
| CN | 110911386 A | 3/2020 |
| CN | 111044883 A | 4/2020 |
| CN | 111063386 A | 4/2020 |
| CN | 111341685 A | 6/2020 |

OTHER PUBLICATIONS

Notice of Allowance cited in CN202010667480.2, dated Sep. 16, 2022., 8 pages.

Written Opinion cited in PCT/CN2021/100358, dated Sep. 15, 2021, 6 pages.

* cited by examiner

TESTING METHOD, TESTING SYSTEM, AND TESTING APPARATUS FOR SEMICONDUCTOR CHIP

CROSS-REFERENCE TO RELATED APPLICATIONS

The present application claims priority to Chinese Patent Application No. 202010667480.2, entitled "TESTING METHOD, TESTING SYSTEM, AND TESTING APPARATUS FOR SEMICONDUCTOR CHIP" and filed on Jul. 13, 2020, the entire contents of which are incorporated herein by reference.

TECHNICAL FIELD

The present application relates to the field of integrated circuit technologies, in particular to a testing method, a testing system, and a testing apparatus for a semiconductor chip.

BACKGROUND

Electronic components (products) are manufactured through a plurality of machining programs. Therefore, in order to ensure a product quality, the electronic components (products) are subjected to a detecting operation after being manufactured, so as to detect whether the electronic components are damaged during the manufacturing procedure, and thus, detect defective products. This is a so-called burn-in test (or referred to as a BIT). During a majority of the burn-in tests, a testing operation is performed on an analyte by placing the analyte within a high temperature environment in a heating furnace. Where a product on the verge of damage or with a poor quality is detected under a strict testing condition in advance, and it is expected that the products pass an earlier stage test to enter a stable phase at an earlier time, a customer may obtain a stable product feature when using the products.

Subsequent to the burn-in test, several failed chips (abnormal chips) are taken for an electrical failure analysis (EFA), so as to confirm a root of the chip failure problem. Failure modes include column, row, block, singlebit, doublebit, and other types of failure modes. In the case where a block failure mode of block fail occurred is tested by the electrical failure analysis, the test has a long testing period, and in the case where analytical samples are less in quantity, it may not be known immediately whether a failure of the burn-in test is a block failure.

SUMMARY

One aspect of the present application provides a testing method for a semiconductor chip, including: acquiring a target chip; obtaining an abnormal chip after a test of read and write functions is performed separately on a preset number of memory cells in an edge region of the target chip; recording location information of individual memory cells with abnormal read and write functions on the abnormal chip; judging whether an abnormality of read and write functions of the abnormal chip is a block abnormality based on the location information; wherein the abnormal chip refers to the target chip including the memory cell with abnormal read and write functions.

Another aspect of the present application provides a testing system for a semiconductor chip to test a target chip, including: a set unit configured to set a preset number of memory cells in an edge region of the target chip as cells to be tested; a test unit connected to the set unit, which is configured to obtain test data after performing a test of read and write functions on the cell to be tested; a process unit connected to the test unit, which is configured to obtain, based on the test data, an abnormal chip with abnormal read and write functions, and location information of individual memory cells with abnormal read and write functions on the abnormal chip, the process unit is further configured to judge whether an abnormality of read and write functions of the abnormal chip is a block abnormality based on the location information; wherein the abnormal chip refers to the target chip including the memory cell with abnormal read and write functions.

Yet another aspect of the present application provides a testing apparatus for a semiconductor chip, the testing apparatus including the testing system described above.

Details of one or more embodiments of the present invention are presented in the accompanying drawings and descriptions below. Other features, objectives, and advantages of the present invention will become apparent from the description, the accompanying drawings, and the claims.

BRIEF DESCRIPTION OF DRAWINGS

In order to more clearly illustrate the embodiments of the present application or the technical solutions of the traditional technology, the accompanying drawings required to be used in the description of the embodiments or traditional techniques will be briefly introduced below. Additional details or examples for describing the accompanying drawings should not be considered as a limitation to a scope of any one of an innovation and creation of the present application, the embodiments described currently or preferred implementations.

DESCRIPTION OF EMBODIMENTS

Figure 1:
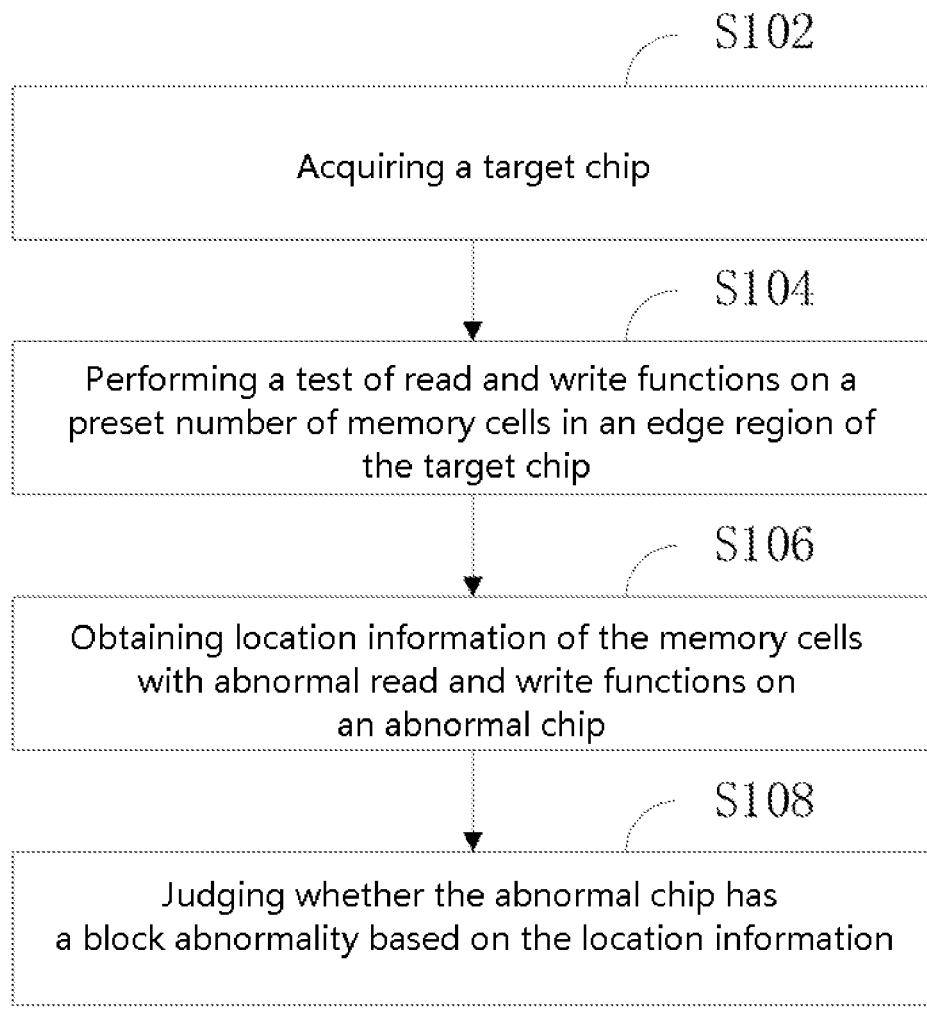
FIG. 1 is a flow diagram of a testing method for a semiconductor chip according to an embodiment.

In order to facilitate to understand the present application, a more complete description of the present application is provided below with reference to the relevant drawings. Preferred embodiments of the present application are given in the drawings. However, the present application may be implemented in a number of different ways without limiting to the embodiments described herein. Instead, the purposes of providing these embodiments are leading to a more thorough and complete understanding of the disclosure of the present application.

Unless otherwise defined, all of the technical and scientific terms used herein have the same meanings as would generally understood by the person skilled in the technical field of the present application. In this document, the terms used in the description of the present application is merely for the purpose of describing particular embodiments, and is not intended to limit the present application.

When used herein, a singular form of "a", "one" or "the" may also mean plurals, unless otherwise clearly specified in the context. It should also be appreciated that, when the terms of "consist of" and/or "comprise/include" are used in the specification, it can be determined the presence of the feature, integer, step, operation and/or component, but not excluding the presence or addition of one or more other feature, integer, step, operation, element, component and/or group. Meanwhile, when used herein, the term "and/or" means that any or all combinations of the listed relevant items are included.

In a manufacturing procedure, several chips are designed on a piece of wafer; subsequent to a manufacturing process, the chips manufactured on the wafer are split into single pieces of chips, and then, each is packaged to form a product; the resulting product is then tested to detect a defective product. In the course of from the chip production to the packaging into a product, thinning, transporting, splitting, packaging, and other processes may cause abnormalities, such as slightly lacking corners or having cracks, to the edge of the chip. These abnormalities are sometimes difficult to be perceived, particularly for a stacked memory chip formed through stacking a plurality of thinned chips, and in the case where interlayer chips of the memory chip lacks corners or has cracks, during a test for the packaged chip, it is difficult to discover that those test abnormalities are caused by the chip lacking corners or having cracks.

During an electrical failure analysis (EFA) subsequently performed on a failed chip, discovering a block failure of chip cracks caused by the chip lacking a corner has a long period, and in the case where less samples are used for the electrical failure analysis, whether it is a block failure may not be confirmed, and a root cause for the burn-in failure problem may not be known immediately.

As illustrated in FIG. 1, in one of the embodiments, a testing method for a semiconductor chip is provided, which includes the following steps.

S102: acquiring a target chip.

The chips on a wafer are split and packaged to form a plurality of packaged chips; any one of the packaged chips is selected as the target chip configured for subsequent steps.

S104: performing a test of read and write functions on a preset number of memory cells in an edge region of the target chip.

A test of read and write functions is performed separately on the preset number of individual memory cells in an edge region of the target chip, so as to obtain an abnormal chip which has a memory cell with abnormal read and write functions, i.e., the abnormal chip is the target chip including the memory cell with abnormal read and write functions. The memory cells subjected to the test of read and write functions are the memory cells obtained by counting the preset number (e.g., 4, 6, 8, 16, 32, 64, etc.) from an edge of the target chip towards an inside of the target chip. The target chip with abnormal functions in the edge region may be found by performing the test of read and write functions on the preset number of memory cells in the edge region of the target chip, and then whether the abnormality of read and write functions is a block abnormality is obtained based on the locations of the memory cells with abnormal read and write functions in the edge region, which shortens the period of confirming a block abnormality on the target chip.

The target chip includes memory cells in a plurality of memory banks. For example, the target chip includes 4 memory banks, or 16 memory banks. In individual memory banks, the memory cells located in the edge region of the target chip are selected for the test of read and write functions.

S106: obtaining location information of the memory cells with abnormal read and write functions on the abnormal chip.

Records are logged for the location information of individual memory cells with abnormal read and write functions on the abnormal chip, namely confirming a distribution of the memory cells with abnormal read and write functions among the memory cells in the edge region of the abnormal chip.

S108: judging whether the abnormal chip has a block abnormality based on the location information.

The distribution of the memory cells with abnormal read and write functions on the abnormal chip may be obtained based on the recorded location information of individual memory cells with abnormal read and write functions on the abnormal chip, and then a judgment is made regarding whether the abnormality of read and write functions of the abnormal chip is the block abnormality.

In one of the embodiments, the target chip includes a stacked memory chip; for example, the target chip includes a single die formed through stacking a plurality of thinned chips. In other embodiments, the target chip includes a single die formed by a single thinned chip.

In one of the embodiments, the preset number of memory cells include A rows and B columns of memory cells in the edge region of the target chip, where both A and B are integers.

In one of the embodiments, the preset numbers of memory cells are A rows of memory cells in one edge region and/or B columns of memory cells in another region of the target chip. In other embodiments, the preset numbers of memory cells are a sum of A rows of memory cells picked from two opposite edges of the target chip and/or a sum of B columns of memory cells picked from the other two opposite edges of the target chip.

In one of the embodiments, the preset numbers of memory cells include C rows and C columns of memory cells in the edge region of the target chip, where C is an integer.

Figure 2:
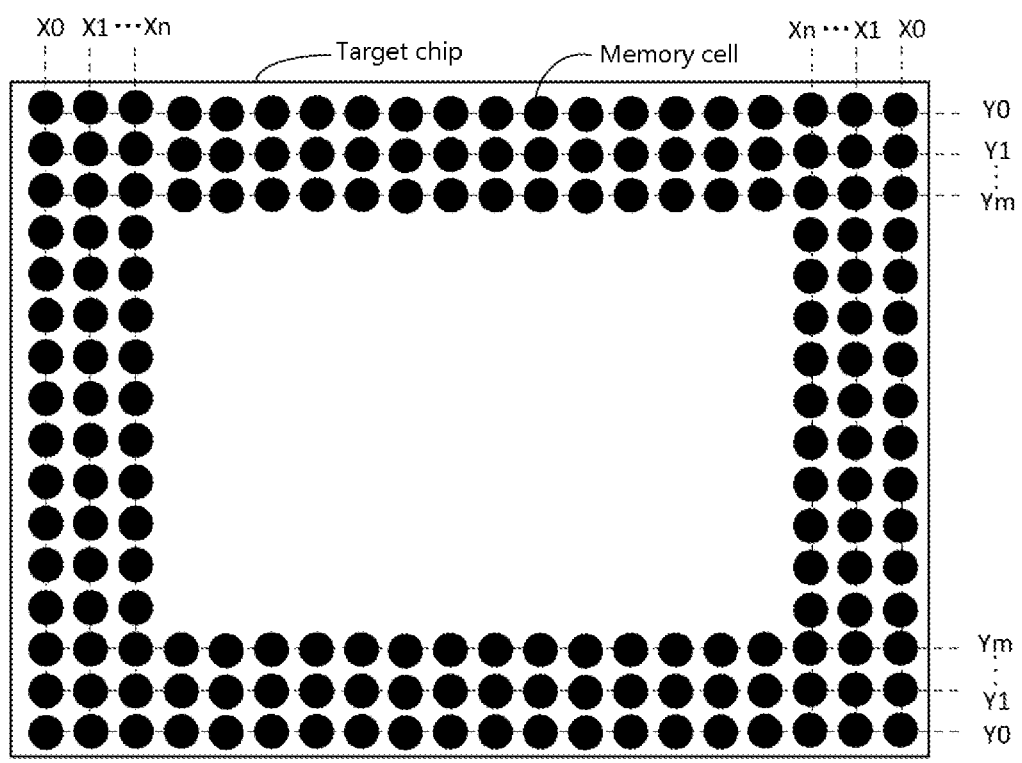
FIG. 2 is a schematic diagram of selecting a preset number of memory cells in an edge region of a target chip according to an embodiment.

As illustrated in FIG. 2, m rows of memory cells are picked from each of top and bottom edges of the target chip (in other embodiments, m1 and m2 rows of memory cells are picked from each of top and bottom edges of the target chip, respectively, where m1≠m2), and n columns of memory cells are picked from each of left and right edges of the target chip (in other embodiments, n1 and n2 columns of memory cells are picked from each of left and right edges of the target chip, n1≠n2). A test of read and write functions is performed separately on the 2m rows and 2n columns of memory cells; if the read and write functions are normal for all of the memory cells, the target chip is a normal chip; if portions of the memory cells have abnormal read and write functions, the target chip is an abnormal chip. A record is logged for the location information of the memory cells with abnormal read and write functions on the abnormal chip; if the memory cells with abnormal read and write functions are consecutive columns or rows of memory cells on the abnormal chip, the abnormality of read and write functions of the abnormal chip is considered to be a block abnormality; otherwise, the abnormality of read and write functions of the abnormal chip is considered to be a non-block-abnormality.

Figure 3:
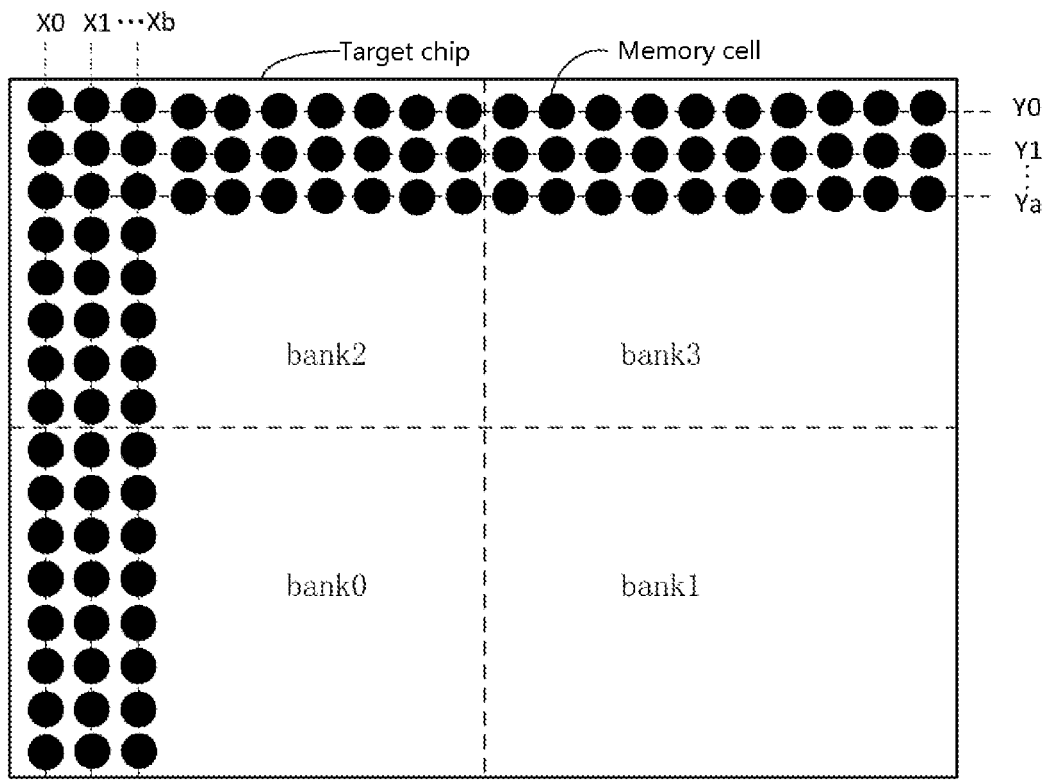
FIG. 3 is a schematic diagram of selecting a preset number of memory cells in an edge region of a target chip according to another embodiment.

As illustrated in FIG. 3, the target chip includes four memory banks of bank0, bank1, bank2, and bank3, b columns of memory cells are selected from the edge region of the memory banks of bank0 and bank2, and a rows of memory cells are selected from the edge region of the memory banks of bank2 and bank3. A test of read and write functions is performed separately on the selected a rows and b columns of memory cells; if the read and write functions are normal for all of the memory cells, the target chip is a normal chip; if portions of the memory cells have abnormal read and write functions, the target chip is an abnormal chip. A record is logged for the location information of the memory cells with abnormal read and write functions on the abnormal chip; if the memory cells with abnormal read and write functions are consecutive columns or rows of memory cells on the abnormal chip, the abnormality of read and write functions of the abnormal chip is considered to be a block abnormality; otherwise, the abnormality of read and write functions of the abnormal chip is considered to be a non-block-abnormality. In other embodiments, it is also possible to only select and perform the test of read and write functions on b columns of memory cells in the edge region of the memory banks of bank0 and bank2, or a rows of memory cells in the edge region of the memory banks of bank2 and bank3, and the judging method is the same.

In one of the embodiments, the step of judging whether the abnormality of read and write functions of the abnormal chip is the block abnormality based on the location information includes:

if the memory cells with abnormal read and write functions are multiple rows or columns of memory cells on the abnormal chip, the abnormality of read and write functions of the abnormal chip is determined to be the block abnormality; otherwise, the abnormality of read and write functions of the abnormal chip is determined to be the non-block-abnormality; wherein the multiple rows or columns of memory cells refer to not less than 2 rows or not less than 2 columns of memory cells on the abnormal chip.

In one of the embodiments, the testing method is executed during the burn-in test. For example, the test may be performed in a pretest stage of a burn-in test procedure, or a test stage preceding to the burn-in or a burn-in test stage of the burn-in test procedure.

In one of the embodiments, if the memory cells with abnormal read and write functions are multiple rows or columns of memory cells in the edge region of the abnormal chip, the abnormal chip is determined to have an abnormality of lacking corners or having cracks; wherein the multiple rows or columns of memory cells refer to not less than 2 rows or not less than 2 columns of memory cells on the abnormal chip.

The testing method for a semiconductor chip described above includes: acquiring target chips; obtaining an abnormal chip after a test of read and write functions is performed separately on a preset number of memory cells in an edge region of each of the target chips; recording location information of individual memory cells with abnormal read and write functions on the abnormal chip; judging whether an abnormality of read and write functions of the abnormal chip is a block abnormality based on the location information; wherein the abnormal chip refers to the target chip including the memory cell with abnormal read and write functions. The present application confirms whether the target chip has an abnormality by performing the test of read and write functions on the preset number of memory cells in the edge region of the target chip; if the memory cell has abnormal read and write functions, the target chip is determined to be an abnormal chip, and a record is logged for the location information of the memory cells with abnormalities on the target chip, and then whether the abnormality of read and write functions of the abnormal chip is a block abnormality is judged based on the recorded location information. The test of confirming whether the abnormality of read and write functions of the abnormal chip is a block abnormality according to the present application has a short period and a low cost.

Figure 4:
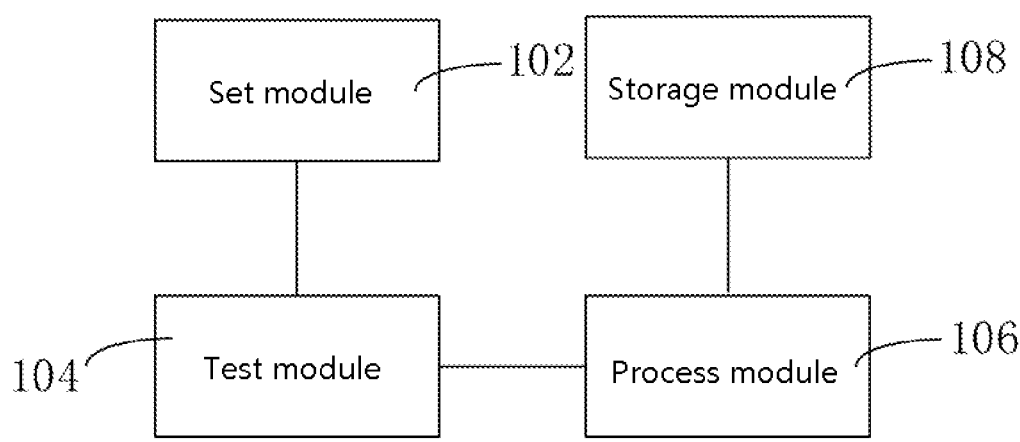
FIG. 4 is a block diagram illustrating a structure of a testing system for a semiconductor chip according to an embodiment.

As illustrated in FIG. 4, in one of the embodiments, a testing system for a semiconductor chip is provided for testing a target chip, the testing system including the following parts.

A set unit 102 is configured to set a preset number of memory cells in the edge region of the target chip as cells to be tested.

The target chip includes memory cells in a plurality of memory banks. For example, the target chip includes 4 memory banks, or 16 memory banks. The set unit 102 is configured to set the memory cells of individual memory banks, which is located in the edge region of the target chip, to be subjected to the test of read and write functions.

A test unit 104 connected to the set unit 102 is configured to obtain test data after performing the test of read and write functions on the cells to be tested.

A process unit 106 connected to the test unit 104 is configured to obtain, based on the test data, an abnormal chip with abnormal read and write functions, and location information of individual memory cells with abnormal read and write functions on the abnormal chip; the process unit 106 is further configured to judge whether an abnormality of read and write functions of the abnormal chip is a block abnormality based on the location information; wherein the abnormal chip refers to the target chip including the memory cell with abnormal read and write functions.

In one of the embodiments, the set unit 102 is configured to set A rows and B columns of memory cells in the edge region of the target chip as the cells to be tested, where both A and B are integers.

In one of the embodiments, the set unit 102 is configured to set A rows and B columns of memory cells in the edge region of the target chip as the cells to be tested, where both A and B are integers.

In one of the embodiments, the set unit 102 is configured to set A rows of memory cells in one edge region and/or B columns of memory cells in another region of the target chip as the cells to be tested. In other embodiments, the set unit 102 is configured to set a sum of A rows of memory cells picked from two opposite edges of the target chip and/or a sum of B columns of memory cells picked from the other two opposite edges of the target chip as the cells to be tested.

In one of the embodiments, the preset numbers of memory cells include C rows and C columns of memory cells in the edge region of the target chip, where C is an integer.

In one of the embodiments, the process unit is configured to obtain a distribution of the memory cells with abnormal read and write functions on the abnormal chip based on the location information, and to determine the abnormal chip to have an abnormality of lacking corners or having cracks if the memory cells with abnormal read and write functions are multiple rows or columns of memory cells towards a center of the abnormal chip from an edge of the abnormal chip.

The multiple rows or columns of memory cells refer to not less than 2 rows or not less than 2 columns of memory cells.

In one of the embodiments, the process unit 106 is configured to obtain the distribution of the memory cells with abnormal read and write functions on the abnormal chip based on the location information, to determine the abnormality of read and write functions of the abnormal chip to be a block abnormality if the memory cells with abnormal read and write functions are multiple rows or columns of memory cells in the edge region of the abnormal chip; otherwise, to determine the abnormality of read and write functions of the abnormal chip to be a non-block-abnormality.

The multiple rows or columns of memory cells refer to not less than 2 rows or not less than 2 columns of memory cells.

In one of the embodiments, the testing system further includes a storage unit 108 connected to the process unit 106, which is configured to store location information of individual memory cells with abnormal read and write functions located on the abnormal chip. The storage unit 108 is further configured to store location information of each of the memory cells located on the target chip.

In one of the embodiments, a testing apparatus for a semiconductor chip is provided; the testing apparatus includes any one of the testing systems described above.

The aforementioned testing system and testing apparatus for the semiconductor chip is used to test a target chip, including: a set unit configured to set a preset number of memory cells in an edge region of the target chip as cells to be tested; a test unit connected to the set unit, which is configured to obtain test data after performing a test of read and write functions on the cell to be tested; a process unit connected to the test unit, which is configured to obtain, based on the test data, an abnormal chip with abnormal read and write functions, and location information of individual memory cells with abnormal read and write functions on the abnormal chip, the process unit is further configured to judge whether an abnormality of read and write functions of the abnormal chip is a block abnormality based on the location information; wherein the abnormal chip refers to the target chip including the memory cell with abnormal read and write functions. The present application confirms whether the target chip has an abnormality by performing the test of read and write functions on the memory cells in the edge region of the target chip, and then whether the abnormality of read and write functions of the abnormal chip is a block abnormality is judged based on the location information, on the target chip, of the memory cells with abnormal read and write functions located on the abnormal chip. The test of confirming whether the abnormality of read and write functions of the abnormal chip is a block abnormality according to the present application has a short period and a low cost.

Technical features of the embodiments described above may be arbitrarily combined, but not all of the potential combinations are described so as to make the description concise. However, all of the combinations of these technical features should be considered as the scope recited in the specification as long as they have no conflict therein.

The embodiments described above merely show several implementations of the present application. The descriptions thereof are specific and detailed, but should not be interpreted as limiting the scope of the patent application. It should be noted that the person skilled in the art could further make several variations and improvements without departing the concept of the present application, and these variations and improvements belong to the scope sought for protection in the present application. Therefore, the protection scope of the present patent application shall be subject to the claims.

What is claimed is:

1. A testing method for a semiconductor chip, comprising:
   acquiring a target chip;
   obtaining an abnormal chip after a test of read and write functions is performed on a preset number of memory cells in an edge region of the target chip, wherein obtaining the abnormal chip comprises determining that the target chip is the abnormal chip based upon the target chip comprising memory cells with abnormal read and write functions;
   recording location information of the memory cells with abnormal read and write functions; and
   judging whether an abnormality of read and write functions of the abnormal chip is a block abnormality based on the location information, comprising:
   when the memory cells with abnormal read and write functions are more than two consecutive full rows or more than two consecutive full columns in the edge region of the memory cells on the abnormal chip, determining that the abnormality of read and write functions of the abnormal chip are the block abnormality.

2. The method according to claim 1, wherein the target chip comprises a stacked memory chip.

3. The method according to claim 1, wherein the preset number of the memory cells comprise A rows and B columns of the memory cells in the edge region of the target chip, wherein both A and B are integers.

4. The method according to claim 1, wherein the testing method is executed during a burn-in test.

5. The method according to claim 1, wherein when the memory cells with abnormal read and write functions are multiple rows or columns of the memory cells towards a center of the abnormal chip from an edge of the abnormal chip, the abnormal chip is determined to have an abnormality of lacking corners or having cracks;
   wherein the multiple rows or columns of the memory cells refer to not less than 2 rows or not less than 2 columns of the memory cells on the abnormal chip.

6. A testing system for a semiconductor chip, the testing system being configured for testing a target chip and comprising:
   a set unit configured to set a preset number of memory cells in an edge region of the target chip as cells to be tested;
   a test unit connected to the set unit and configured to obtain test data after performing a test of read and write functions on the cells to be tested; and
   a process unit connected to the test unit, the process unit being configured to obtain, based on the test data, an abnormal chip with abnormal read and write functions, and location information of memory cells with abnormal read and write functions on the abnormal chip, and the process unit being further configured to judge whether an abnormality of read and write functions of the abnormal chip is a block abnormality based on the location information;
   wherein the process unit is further configured to determine that the target chip is the abnormal chip based upon the target chip comprising the memory cells with abnormal read and write functions; and
   wherein the process unit is further configured to determine the abnormality of read and write functions of the abnormal chip to be the block abnormality when the memory cells with abnormal read and write functions are more than two consecutive full rows or more than two consecutive full columns in the edge region of the memory cells on the abnormal chip.

7. The testing system according to claim 6, wherein the set unit is configured to set A rows and B columns of the memory cells in the edge region of the target chip as the cells to be tested, wherein both A and B are integers.

8. The testing system according to claim 6, wherein the process unit is configured to obtain a distribution of the memory cells with abnormal read and write functions on the abnormal chip based on the location information.

9. The testing system according to claim 6, wherein the testing system further comprises a storage unit connected to the process unit, the storage unit being configured to store the location information of the memory cells with abnormal read and write functions located on the abnormal chip, and the storage unit being further configured to store location information of each of the preset number of the memory cells located on the target chip.

10. A testing apparatus for a semiconductor chip, comprising the testing system according to claim 6.

* * * * *